(12) United States Patent
Hunt et al.

(10) Patent No.: US 6,388,469 B1
(45) Date of Patent: May 14, 2002

(54) MULTIPLE POWER SUPPLY OUTPUT DRIVER

(75) Inventors: Jeffery Scott Hunt, Ackerman; Muthukumar Nagarajan, Starkville, both of MS (US)

(73) Assignee: Cypress Semiconductor Corp., San Jose, CA (US)

( * ) Notice: Subject to any disclaimer, the term of this patent is extended or adjusted under 35 U.S.C. 154(b) by 0 days.

(21) Appl. No.: 09/373,870

(22) Filed: Aug. 13, 1999

(51) Int. Cl.⁷ .......................................... H03K 19/0175
(52) U.S. Cl. ............... 326/81; 326/83; 326/68
(58) Field of Search ............... 326/68, 70, 71, 326/80, 81, 83, 86

(56) References Cited

U.S. PATENT DOCUMENTS

| | | | | |
|---|---|---|---|---|
| 5,128,560 A | * | 7/1992 | Chern et al. ............ | 326/80 |
| 5,378,943 A | * | 1/1995 | Dennard .................. | 326/68 |
| 5,903,142 A | | 5/1999 | Mann ....................... | 323/313 |
| 5,929,656 A | * | 7/1999 | Pagones .................. | 326/81 |
| 5,933,025 A | | 8/1999 | Nance et al. ............ | 326/81 |
| 6,005,413 A | * | 12/1999 | Schmitt ................... | 326/80 |
| 6,040,729 A | * | 3/2000 | Sanchez et al. ......... | 326/81 |

OTHER PUBLICATIONS

Cypress Preliminary Ultra37000™ CPLD Family, 5V, 3.3V, ISR High–Performance CPLDs, Cypress Semiconductor Corporation, Aug. 13, 1999, pp. 1–65.

\* cited by examiner

*Primary Examiner*—Michael Tokar
*Assistant Examiner*—Don Phu Le
(74) *Attorney, Agent, or Firm*—Christopher P. Maiorana, P.C.

(57) ABSTRACT

An apparatus comprising a first circuit and a second circuit. The first circuit may be configured to generate a first control signal and a second control signal in response to (i) a first input signal, (ii) a second input signal and (iii) a voltage control signal. The second circuit configured to generate (i) an output signal in response to the first and the second control signals and (ii) the voltage control signal in response to a pad voltage.

18 Claims, 5 Drawing Sheets

MULTIPLE POWER SUPPLY OUTPUT DRIVER

FIELD OF THE INVENTION

The present invention relates to output driver circuits generally and, more particularly, to a high voltage tolerant output driver circuit for mixed power supply levels.

BACKGROUND OF THE INVENTION

The trend in modern central processing units (CPUs) and microprocessors is to reduce the power supply operating voltage in order to reduce power consumption and increase the chip density. The power supply reduction may impact other performance considerations as well. Due to the design considerations, memory devices, such as dynamic random access memories (DPAMs), may operate at a different supply voltage than the CPU. Some devices also may be required to use more than one power supply voltage so they can signal a CPU related device at one voltage and other devices at another voltage. The signals are generally generated by one circuit and are received by another circuit.

One such configuration occurs with modern microprocessors that operate with a nominal power supply voltage of about 2.5 V (or lower) while other circuits in the computer operate with a power supply voltage of about 3.3 V. To facilitate communication between devices operating at different voltages, an output driver circuit is used.

Referring to FIG. 1, a circuit 10 is illustrating a conventional approach. The circuit 10 generally comprises a core logic circuit 12, an output driver circuit 14 and a circuit 16. The circuit 16 is an external device. The circuit 12 and the circuit 16 form a circuit 15. The output driver circuit 14 receives a pullup signal PU and a pulldown signal PD from the core logic 12. The pull signals PU and PD swing between ground and a core supply voltage level VCC_CORE. The output driver circuit 14 comprises a level shifter 17, a level shifter 18, a pad driver circuit 20, and a tolerance circuit 24. The level shifters 17 and 18 shift the levels of the pull signals PU and PD, respectively, from the voltage VCC_CORE to a second supply voltage VCCIO. The level shifters 17 and 18 generate a level shifted pullup signal PUG and a level shifted pulldown signal PDG, respectively. The level shifted pull signals PUG and PDG are presented to the pad driver circuit 20. The pad driver circuit 20 generates a signal PAD at an output 22 in response to the level shifted pull signals PUG and PDG. The signal PAD is presented to a pad 30. The tolerance circuit 24 provides high voltage tolerance should the signal PAD be connected to a device (i.e., the circuit 16) operating at a higher voltage than the second supply voltage (i.e., where VCCEXT>VCCIO). The tolerance circuit 24 generates a first output signal NSUB at a first output 26 and a second output signal HV at a second output 28 in response to the second supply voltage VCCIO and the voltage of the signal PAD. The output signals NSUB and HV are used to disable a PMOS pull-up device in the pad driver circuit when the pad voltage is higher than the second supply voltage.

FIG. 2 is a diagram of a circuit 14' illustrating a conventional approach for implementing a high voltage tolerance circuit 20'. The circuit 20' generally comprises a transistor 46, a transistor 48, a transistor 50, transistor 51 and a pump circuit 56. The transistor 46 is an NMOS device connected between the core circuitry 12 (thin oxide devices) and a gate of the output driver PMOS pull-up transistor 50. The pump circuit 56 is used to pump the gate of the NMOS pass transistor 46 to a voltage above VCCIO (e.g., VCCIO+Vtn).

The voltage Vtn may be a transistor threshold voltage. By having the gate at a voltage above VCCIO, the core VCC level is passed to the gate of the PMOS pull-up device 50 to ensure the device 50 can be shut off during normal operation. The PMOS transistor 48 allows the tolerance circuit 24 to pull the gate of the PMOS pull-up device 50 to the pad level VCCEXT for high voltage tolerance. The purpose of the tolerance circuit 24 is to detect when the pad voltage is higher than the voltage VCCIO and force the nwell of transistor 50 and the gate of transistor 50 to the pad voltage. This avoids forward biasing the diode formed by the drain and nwell (e.g., body) of the transistor 50 that would otherwise become a latch-up risk.

FIG. 3 illustrates another conventional approach of an output driver circuit 14". A PMOS transistor 78 is placed in series with the output driver PMOS pull-up device 76. A gate of the PMOS transistor 78 is controlled by a signal HV generated by the tolerance circuit 24. During normal operation, the signal HV is always low ("0"). When the pad voltage is higher than the supply voltage (i.e., VCCEXT>VCCIO), the tolerance circuit 24 detects the difference and pulls the gate of the PMOS transistor 78 to the pad voltage level, shutting off the PMOS transistor 78.

The conventional approaches illustrated for implementing high voltage tolerance output drivers have added circuitry to the pad driver to shut off the PMOS pull-up device. The additional circuitry shown in FIG. 2 requires a charge pump and an NMOS pass gate transistor 46. The additional circuitry shown in FIG. 3 (i.e., the PMOS transistor 78) may limit the drive capability.

SUMMARY OF THE INVENTION

The present invention concerns an apparatus comprising a first circuit and a second circuit. The first circuit may be configured to generate a first control signal and a second control signal in response to (i) a first input signal, (ii) a second input signal and (iii) a voltage control signal. The second circuit configured to generate (i) an output signal in response to the first and the second control signals and (ii) the voltage control signal in response to a pad voltage.

The objects, features and advantages of the present invention include providing an output driver circuit that may (i) provide a level shifting circuit, powered by the output of a tolerance circuit that may be the maximum of either a supply voltage (VCCIO) or a voltage presented at the pad, (ii) provide a level shifting circuit that isolates the internal core from the I/O interface to protect the core devices from high voltage levels presented on the pad, (iii) disable the output driver PMOS pull-up device for pad voltages higher than the supply voltage, and/or (iv) combine level shifter and disabling features for a high voltage tolerance circuit.

BRIEF DESCRIPTION OF THE DRAWINGS

These and other objects, features and advantages of the present invention will be apparent from the following detailed description and the appended claims and drawings in which:

DETAILED DESCRIPTION OF THE PREFERRED EMBODIMENTS

Figure 1:
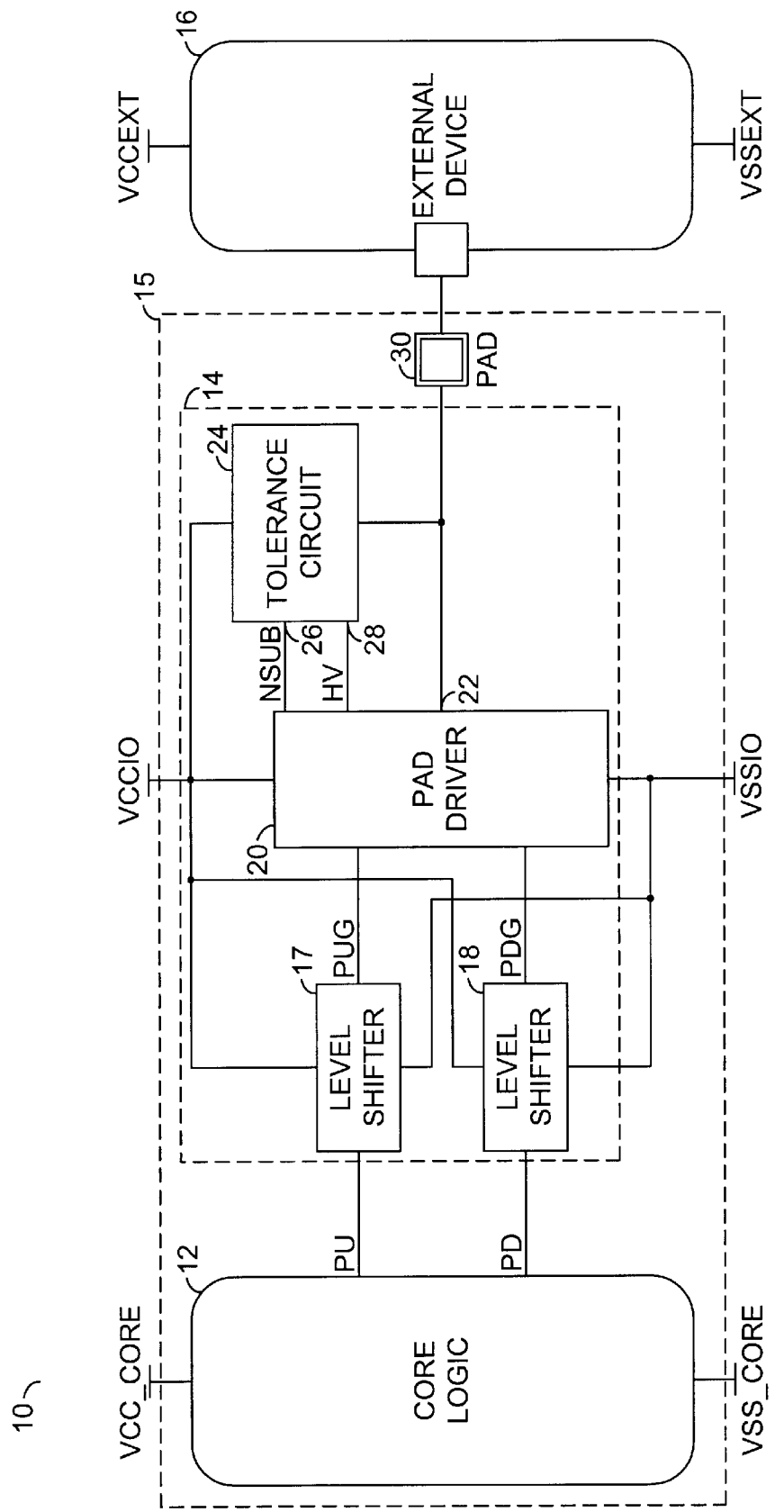
FIG. 1 is a block diagram illustrating an output driver circuit implemented between a core logic circuit and an external device.
Figure 2:
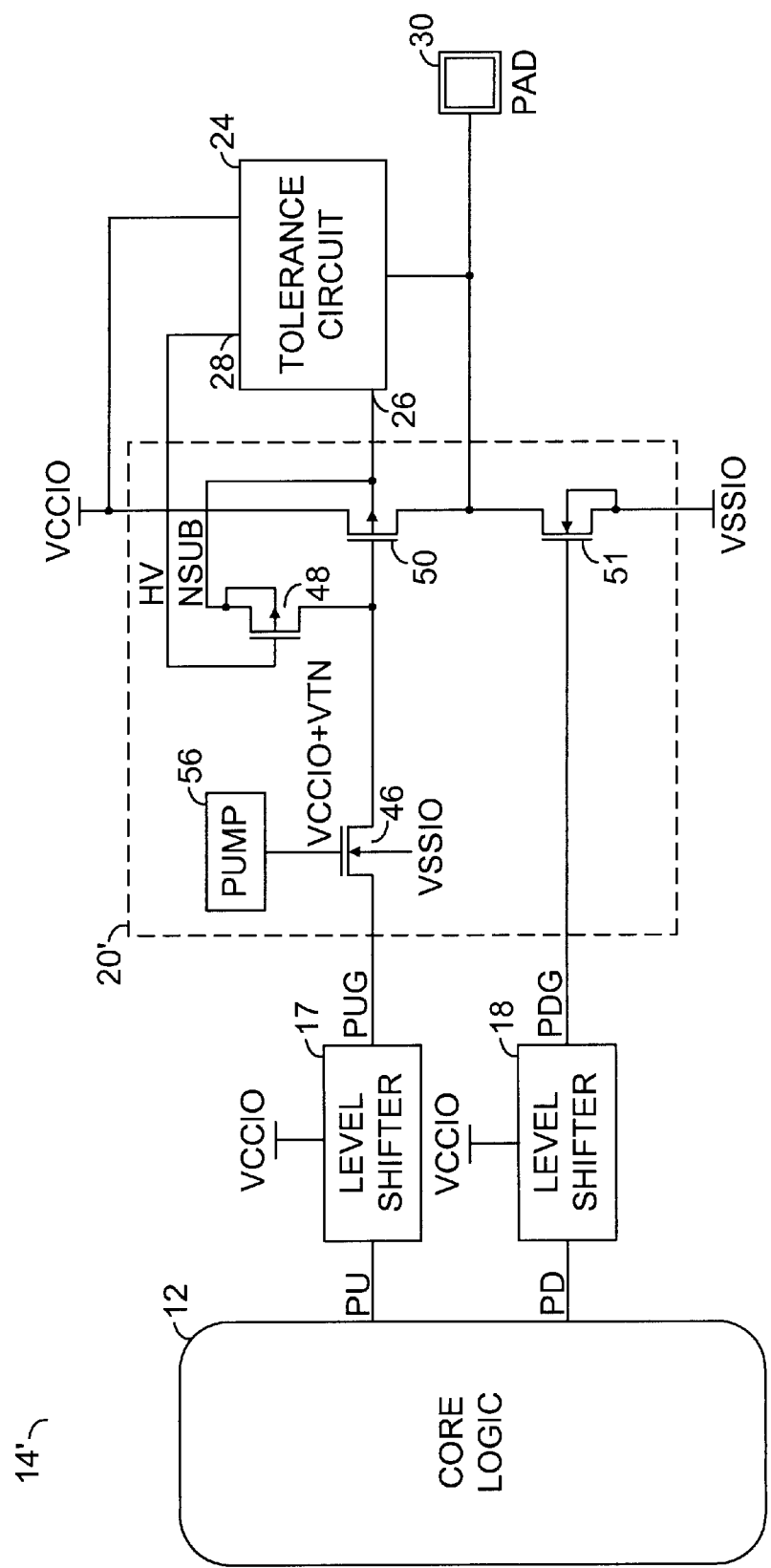
FIG. 2 is a diagram illustrating a conventional output driver.
Figure 3:
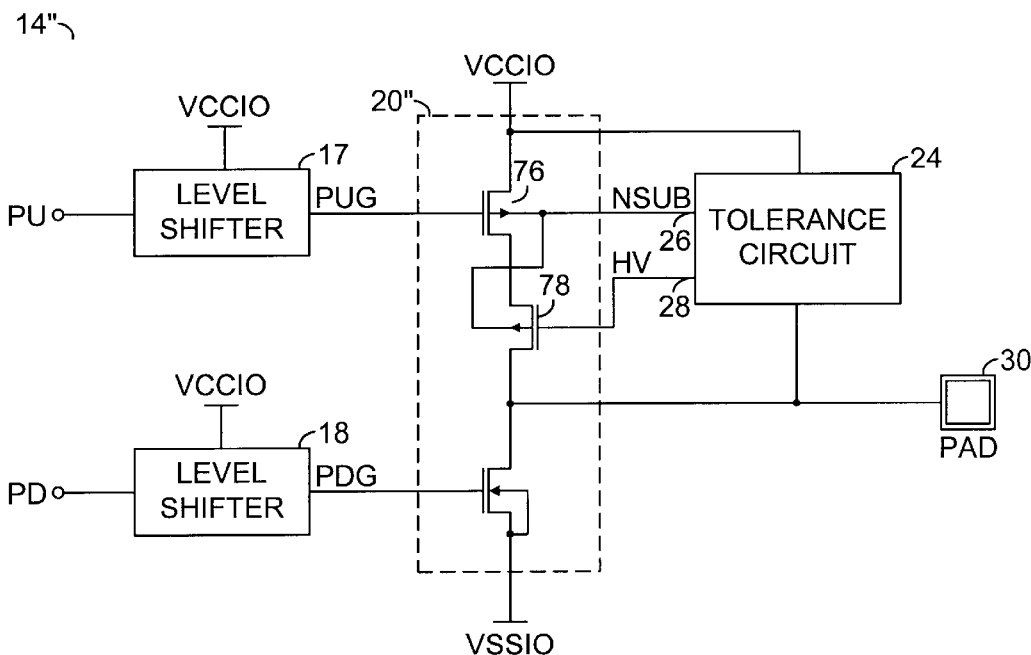
FIG. 3 is a diagram illustrating a second conventional output driver.
Figure 4:
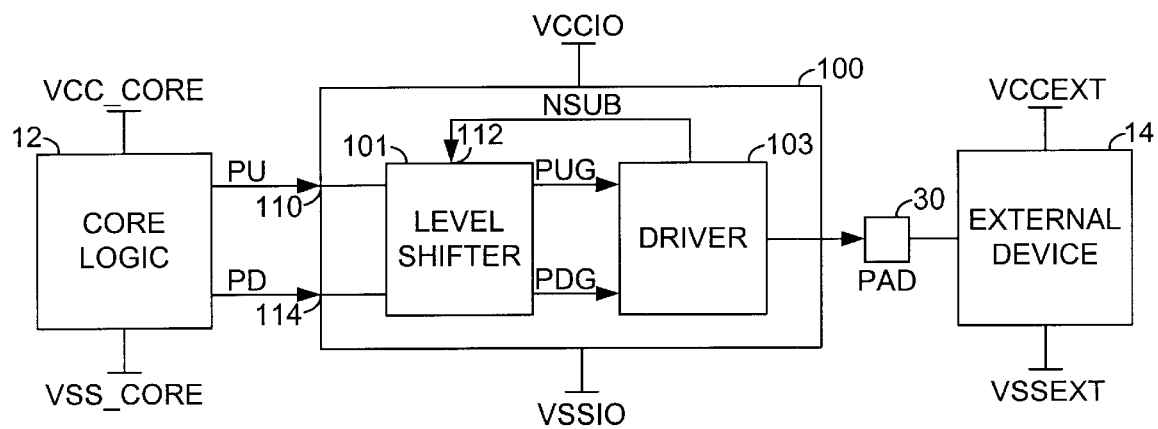
FIG. 4 is a block diagram illustrating a preferred embodiment of the present invention.

Referring to FIG. 4, a block diagram of an output driver circuit 100 is shown in accordance with a preferred embodiment of the present invention. The output driver circuit 100 is shown implemented with a core logic circuit 12 and a circuit 14. The circuit 14 may be an external device operating at a different voltage than the core logic 12. The output driver circuit 100 generally comprises a level shifter block (or circuit) 101 and a driver block (or circuit) 103. The level shifter circuit 101 may receive a signal (e.g., PU) at an input 110, a signal (e.g., NSUB) at an input 112 and a signal (e.g., PD) at an input 114. The driver circuit 103 may generate the signal PAD (e.g., a voltage at the pad 30) in response to a first control signal (e.g., PUG) and a second control signal (e.g., PDG). The driver circuit 103 may also generate the signal NSUB in response to the signal PAD.

Figure 5:
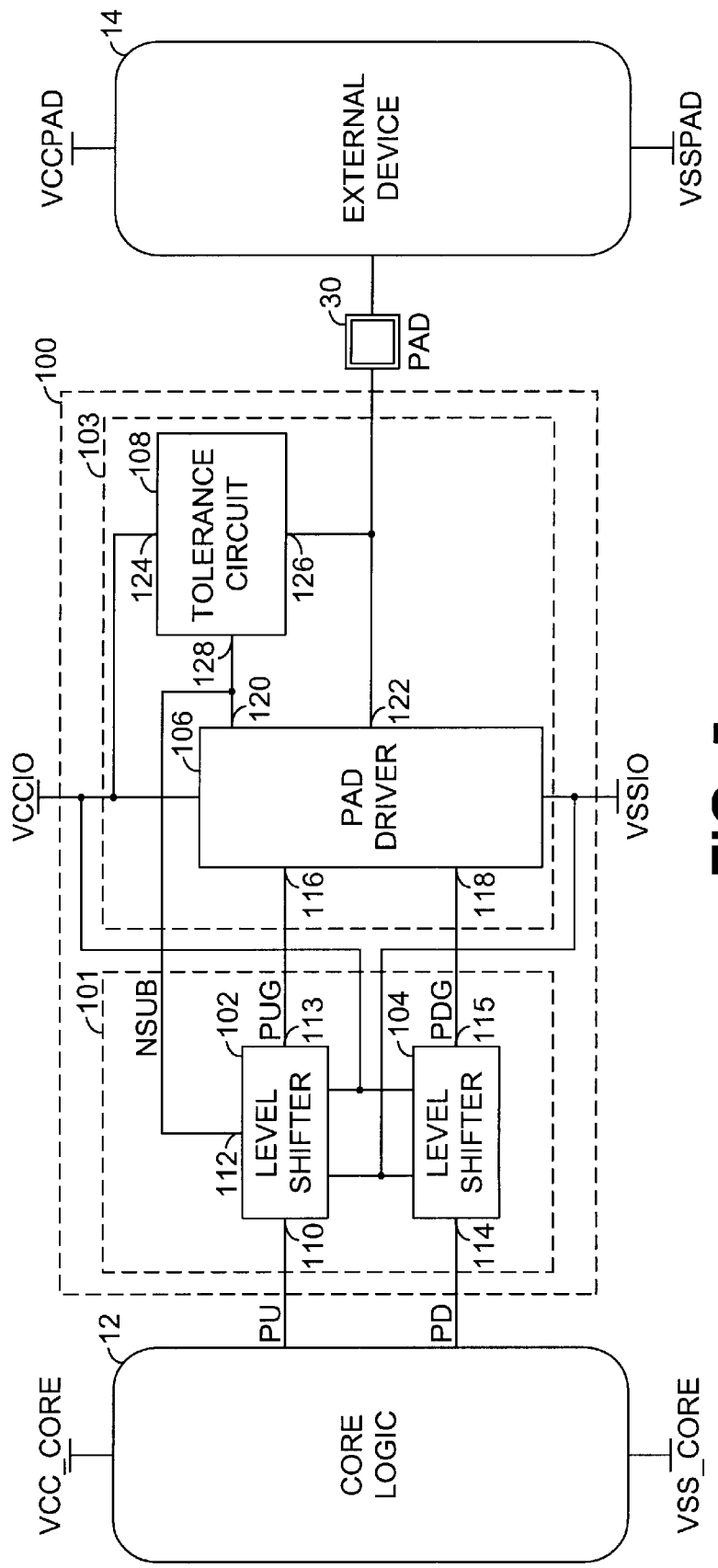
FIG. 5 is a more detailed diagram of a preferred embodiment of the present invention.
Figure 6:
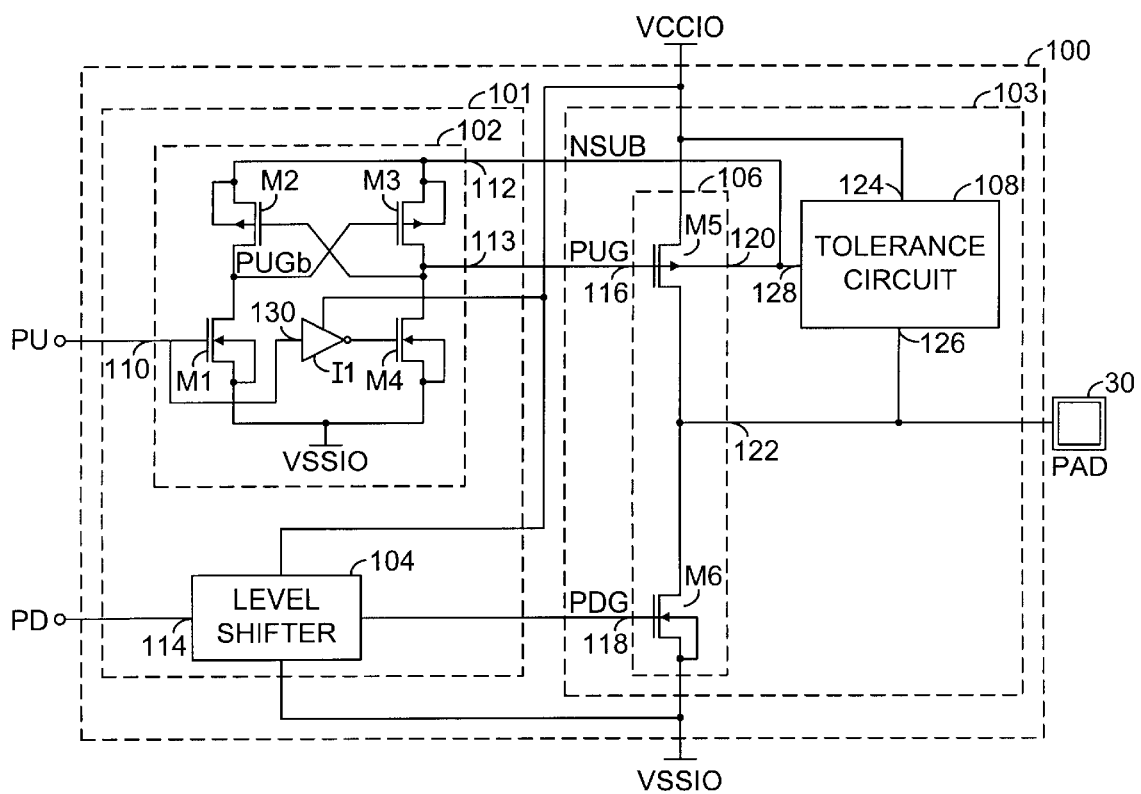
FIG. 6 is a more detailed diagram of the circuits of FIGS. 4 and 5.

Referring to FIG. 5, a more detailed block diagram of an output driver circuit 100 is shown. The level shifter circuit 101 generally comprises a first level shifter circuit 102 and a second level shifter circuit 104. The driver circuit 103 generally comprises a pad driver circuit 106 and a tolerance circuit 108. The level shifter 102 may be configured to receive the signal PU at an input 110 and the signal NSUB at an input 112. The signal PU may be a pullup signal that may swing between ground and a first supply voltage (e.g., VCC_CORE). The signal NSUB may be a supply voltage (e.g., a voltage control signal) that may be either a second supply voltage (e.g., VCCIO) or a pad voltage (e.g., VCCEXT). The level shifter 102 may generate the signal (e.g., PUG) at an output 113 in response to (i) the signal PU and (ii) the signal NSUB. The signal PUG may have the values as described in the following TABLE 1:

FIG. 6 is a more detailed diagram of the level shifter circuit 102 and the pad driver circuit 103. The level shifter circuit 102 generally comprises a transistor M1, a transistor M2, a transistor M3, a transistor M4, and an inverter I1. The transistors M1, M2, M3, and M4 may be implemented, in one example, as one or more MOSFET transistors. Specifically, the transistors M1 and M4 may be implemented as NMOS transistors and the transistors M2 and M3 may be implemented as PMOS transistors. However, the particular polarity of the transistors M1, M2, M3 and M4 may be adjusted accordingly to meet the design criteria of a particular implementation. The inverter I1 may be implemented, in one example, as a CMOS inverter. The signal PU is generally presented to an input 110 (e.g., the gate of the transistor M1) and to an input 130 of inverter I1. The source of the transistor M1 is generally connected to ground (e.g., VSSIO). The drain of the transistor M1 is generally connected to the drain of the transistor M2 and a gate of the transistor M3.

The source of the transistor M2 is generally connected to the source of the transistor M3 and may receive the signal NSUB from the input 112. A gate of the transistor M2 is generally connected to (i) the drain of the transistor M3, (ii) the drain of the transistor M4, and (iii) and the output 113. An output of inverter I1 is generally connected to a gate of the transistor M4. The source of the transistor M4 is generally connected to ground VSSIO.

The pad driver 106 generally comprises a transistor M5 and a transistor M6. The transistors M5, M6 may be implemented, in one example, as MOSFET transistors having a substrate terminal. However, other types of transistors may be implemented accordingly to meet the design criteria of a particular implementation. The signal PUG presented at the input 116, is generally received by a gate of the transistor M5. The source of the transistor M5 is generally connected to the voltage VCCIO. A substrate terminal of the transistor M5 generally receives the signal NSUB from the input 120. The drain of the transistor M5 is generally connected to the drain of the transistor M6 and the output 122. A gate of the

TABLE 1

| PU | PD | PAD | NSUB | PUG | PDG |
|---|---|---|---|---|---|
| VSS_CORE | VSS_CORE | VCCIO | VCCIO | VSSIO | VSSIO |
| VCC_CORE | VCC_CORE | VSSIO | VCCIO | VCCIO | VCCIO |
| VCC_CORE | VSS_CORE | Pad<=VCCIO | VCCIO | VCCIO | VSSIO |
| VCC_CORE | VSS_CORE | Pad>VCCIO | PAD | PAD | VSSIO |

The level shifter 104 may be configured to receive the signal PD at an input 114. The signal PD may swing between ground and a voltage VCC_CORE. The level shifter 104 may generate the signal PDG at an output 115. The signal PDG may swing between ground and the voltage VCCIO in response to the signal PD.

The pad driver circuit 106 may be configured to operate at the supply voltage VCCIO. The pad driver circuit 106 may receive the signal PUG at an input 116, the signal PDG at an input 118, and the signal NSUB at an input 120. The pad driver circuit 106 generally presents the signal PAD at an output 122. The pad driver output 122 may be connected to a pad 30.

The tolerance circuit 108 may be configured to monitor the supply voltage VCCIO received at a first input 124 and the signal PAD at an input 126. The tolerance circuit 108 generally presents the signal NSUB at an output 128. The signal NSUB may have the values described in TABLE 1.

transistor M6 is generally connected to receive the signal PDG presented at the input 118. The source of the transistor M6 is generally connected to ground VSSIO.

The signal NSUB will generally be the higher of the voltage VCCIO or the voltage VCCEXT. If the signal PU is low, the transistor M1 will generally be shut-off and the transistor M4 will generally be conducting. The gate of the transistor M2 will generally be pulled low when the transistor M4 is conducting. With the gate of the transistor M2 low, the transistor M2 will generally conduct, which may pull up the gate of the transistor M3. With the gate of the transistor M3 pulled high, the transistor M3 will generally be shut off. The transistor M4 will generally pull-down the gate of the transistor M5 and the transistor M5 will conduct pulling-up the output signal PAD to the voltage VCCIO.

If the signal PU is high, the transistor M4 will generally be shut off and the transistor M1 will generally be conducting. The transistor M1 will generally pull down the gate of the transistor M3 causing the transistor M3 to conduct. The gate of the transistor M5 will generally be pulled up to the level of the signal NSUB. Since the signal NSUB will generally be the higher of VCCIO or the voltage VCCEXT, the transistor M5 will generally be shut off regardless of whether VCCIO or the voltage VCCEXT is the higher.

The present invention may provide an output driver circuit 100 that may be configured to receive one or more core logic signals that swing between ground and core supply voltage levels. The output driver circuit 100 may present a signal which swings between ground and a second supply voltage level. In the event that the signal PAD generated by the output driver circuit 100 is connected to a device which operates at a higher voltage than the second supply voltage level, the output driver circuit 100 may disable a pull-up device. The pull-up disabling function may be implemented in a level shifter.

While the invention has been particularly shown and described with reference to the preferred embodiments thereof, it will be understood by those skilled in the art that various changes in form and details may be made without departing from the spirit and scope of the invention.

What is claimed is:

1. An apparatus comprising:
   a first circuit configured to generate a first control signal and a second control signal in response to (i) a first input signal, (ii) a second input signal and (iii) a voltage control signal; and
   a second circuit configured to generate said voltage control signal and a pad voltage in response to said first arid said second control signals, wherein said voltage control signal is at (i) a first supply voltage when said pad voltage is at a first voltage less than or equal to said first supply voltage and (ii) said pad voltage when said pad voltage is at a second voltage greater than said first supply voltage.

2. The apparatus according to claim 1, wherein said first circuit comprises a level shifter circuit.

3. The apparatus according to claim 1, wherein said second circuit comprises a driver circuit.

4. The apparatus according to claim 3, wherein said driver circuit comprises an output driver circuit.

5. The apparatus according to claim 1, wherein said first control signal comprises a pullup signal and said second signal comprises a pulldown signal.

6. The apparatus according to claim 1, wherein said first and second input signals are generated in a core logic circuit.

7. The apparatus according to claim 6, wherein said pad voltage is presented to an external circuit.

8. The apparatus according to claim 7, wherein said core logic circuit operates at a second supply voltage and said external circuit operates at a third supply voltage.

9. The circuit according to claim 8, wherein said second circuit operates at said first supply voltage.

10. The apparatus according to claim 9, wherein said second circuit is configured to generate said voltage control signal in further response to said first supply voltage.

11. The apparatus according to claim 1, wherein said first circuit comprises a first level shifter circuit and a second level shifter circuit, wherein said first level shifter circuit is configured to generate said first control signal in response to said first input signal and said voltage control signal.

12. The apparatus according to claim 8, wherein said second circuit further comprises a pad driver circuit and a tolerance circuit, wherein said tolerance circuit is configured to generate said voltage control signal in response to said third supply voltage and said pad voltage.

13. A circuit comprising:
    means for generating a first control signal and a second control signal in response to (i) a first input signal, (ii) a second input signal and (iii) a voltage control signal; and
    means for generating said voltage control signal and a pad voltage in response to said first and said second control signals, wherein said voltage control signal is at (i) a first supply voltage when said pad voltage is at a first voltage less than or equal to said first supply voltage and (ii) said pad voltage when said pad voltage is at a second voltage greater than said first supply voltage.

14. A method for providing high voltage tolerance in an output driver comprising:
    (A) generating a first control signal and a second control signal in response to (i) a first input signal, (ii) a second input signal and (iii) a voltage control signal;
    (B) generating a pad voltage; and
    (C) generating said voltage control signal, wherein said voltage control signal is at (i) a first supply voltage when said pad voltage is at a first voltage less than or equal to said first supply voltage and (ii) said pad voltage when said pad voltage is at a second voltage greater than said first supply voltage.

15. The method according to claim 14, wherein said first control signal comprises a pullup signal and said second signal comprises a pulldown signal.

16. The method according to claim 14, wherein said first and second input signals are generated in a core logic circuit.

17. The method according to claim 14, wherein said pad voltage is presented to an external circuit.

18. The method according to claim 17, wherein said core logic circuit operates at a second supply voltage and said external circuit operates at a third supply voltage.

* * * * *